United States Patent [19]

Lee et al.

[11] Patent Number: 5,248,660
[45] Date of Patent: Sep. 28, 1993

[54] PROCESS OF PREPARING YTTRUIM BASED SUPERCONDUCTORS

[75] Inventors: Een H. Lee, Suwon; I. Hun Song; Seok Y. Yoon, both of Seoul, all of Rep. of Korea

[73] Assignee: Samsung Electro-Mechanics Co., Ltd., Suwon, Rep. of Korea

[21] Appl. No.: 814,874

[22] Filed: Dec. 31, 1991

[30] Foreign Application Priority Data

Aug. 31, 1991 [KR] Rep. of Korea .................... 91-15194

[51] Int. Cl.$^5$ ............................................. H01B 12/06
[52] U.S. Cl. .................................. 505/1; 505/733; 505/742; 501/152; 501/123
[58] Field of Search ..................... 505/1, 783, 742; 501/182, 123

[56] References Cited

U.S. PATENT DOCUMENTS 4,956,336 9/1990 Salama et al. .................. 505/742
4,994,437 2/1991 Yorii et al. ........................ 505/1

FOREIGN PATENT DOCUMENTS 0319807 6/1989 European Pat. Off. .

Primary Examiner—Karl Group
Assistant Examiner—C. M. Bonnar
Attorney, Agent, or Firm—Cushman, Darby & Cushman

[57] ABSTRACT

A process of preparing a yttrium based superconductor including partial melting a body of $YBa_2Cu_3O_y$ compound which is stacked on a $Y_2BaCuO_5$ plate, to produce a liquid phase, $BaCu_2.CuO$ which flows down into the $Y_2BaCuO_5$ plate, a peritectic reaction of the $Y_2BaCuO_5$ of the plate, with the liquid phase, $BaCuO_2.CuO$, to form a $YBa_2Cu_3O_y$ phase, and cooling and annealing the resulting $YBa_2Cu_3O_y$ to gain superconducting properties, in which weak-links are reduced by the well oriented-grains with few voids, and the grains of the fine grained $Y_2BaCuO_5$ phase act as flux pinning centers, which increases the critical current density.

2 Claims, 4 Drawing Sheets

PROCESS OF PREPARING YTTRUIM BASED SUPERCONDUCTORS

BACKGROUND OF THE INVENTION

1. Field of the Invention

The present invention relates to a process of preparing yttrium-based superconductors, particularly to a process of preparing yttrium-based superconductors from a $Y_2BaCuO_5$ compound reacting with liquid phase from a partially-melted $YBa_2Cu_3O_y$ compound.

2. Description of the Prior Art

Although very high critical current density is required for such practical applications as permanent magnets and power transmission, that of high Tc superconductors is very low and becomes much less in a magnetic field. This is known to be mainly due to weak-links between the superconducting grains.

To reduce these weak-links, melt processes, wherein a fused superconducting compound is solidified slowly, have been studied and attempted successfully. One of them is a quench and melt growth process (referred hereinafter as "QMG"), in which the stoichiometric compound of yttrium-based superconductors is heated rapidly to about 1400° C. to form a homogeneous melt, and then cooled slowly to produce a superconductor. Partial melting is another melt process, in which a sintered stoichiometric superconductor is partially-melted to form a $Y_2BaCuO_5$ phase and a liquid phase, and then is cooled slowly. The $YBa_2Cu_3O_y$ superconductor is produced by the peritectic reaction of the $Y_2BaCuO_5$ phase with the liquid phase. The superconductors produced by these melt processes have large well-oriented grains with few voids, so that the weak-links are reduced drastically.

In these methods, however, liquid flowing by gravity cannot be avoidable. If the liquid flows out, the remaining compound suffers compositional change and sometimes cracks or distortion, all of which cause a lower critical current density. Even though rapid heating and/or instantaneous melting are attempted to prevent the liquid-flow, for example by placing the specimen directly in a pre-heated furnace, a thermal shock, in this case, cannot be avoidable, which is more harmful to the superconducting properties.

SUMMARY OF THE INVENTION

An objective of the present invention is to provide a process of preparing yttrium-based superconductors with reduced weak-links and having critical current densities greater than $10^4$ A/cm$^2$. In the present invention, a $Y_2BaCuO_5$ plate is made to react peritectically with the liquid phase from the partial-melted $YBa_2Cu_3O_y$ compound on it.

DETAILED DESCRIPTION OF THE INVENTION

Figure 1:
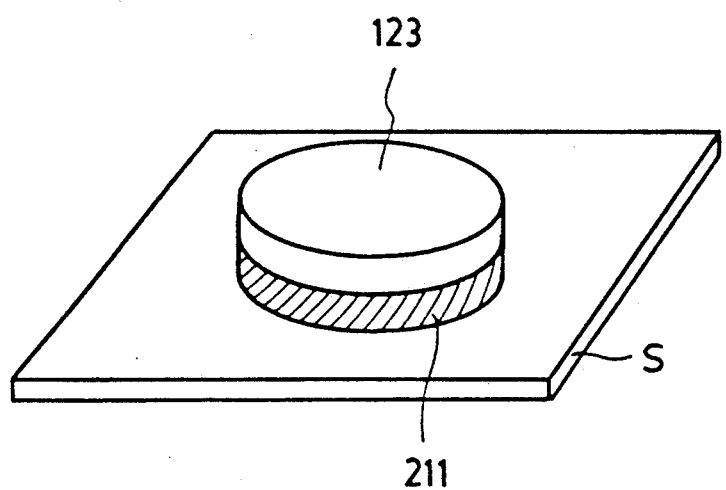
FIG. 1 illustrates a schematic configuration of a vertically stack assembly including (from the top), a body of $YBa_2Cu_3O_y$ compound, a $Y_2BaCuO_5$ plate and a $ZrO_2$ plate used in the present invention.

A process of preparing yttrium-based superconductors according to the present invention is disclosed in detail as follows, referring to the appropriate figures. The present invention comprises the peritectic reaction of the $Y_2BaCuO_5$ of a plate thereof with liquid phase $BaCuO_2.CuO$, flowing down from a body of partially-melted $YBa_2Cu_3O_y$ which is supported on the body of $Y_2BaCuO_5$ (FIG. 1). The liquid phase forms during the partial-melting of the upper body of $YBa_2Cu_3O_y$ compound, and flows into the lower $Y_2BaCuO_5$ plate. The $Y_2BaCuO_5$ plate reacts peritectically with the liquid $BaCuO_2.CuO$ to produce $YBa_2Cu_3O_y$ which grows in a preferred direction. Since the reaction occurs uniformly and homogeneously in the whole $Y_2BaCuO_5$ plate, the resulting $YBa_2Cu_3O_y$ has large grains, with few voids, so that weak-links are reduced drastically. Thus the current density is greatly enhanced, usually to greater than $10^4$ A/cm$^2$.

The process of the present invention may comprise three steps: (1) partial-melting of $YBa_2Cu_3O_y$ compound located on the $Y_2BaCuO_5$ plate to produce liquid phase $BaCuO_2.CuO$, which flows down into the $Y_2BaCuO_5$ plate, (2) peritectic reaction of the $Y_2BaCuO_5$ of the upper plate, with the liquid phase $BaCuO_2.CuO$, to form a $YBa_2Cu_3O_y$ phase, and (3) cooling and annealing the resulting body of $YBa_2Cu_3O_y$ to provide that body with superconducting properties.

In step (1), it is recommended to heat the system to about 1100° C. at a rate of about 300° C./h and to hold it at that temperature for not less than 10 minutes. It is also recommended to quench the system to 1010° C. as rapidly as possible. In step (2), the peritectic reaction is made to occur while the system is cooled to 940° C. slowly at a rate of 2° C./h and held for about 10 hours at 940° C. In step (3), the system is cooled from 940° C. to 890° C. at a rate of 10° C./h, from 890° C. to 600° C. at a rate of 100° C./h, from 600° C. to 400° C. at a rate of 25° C./h, from 600° C. to 400° C. at a rate of 25° C./h, and from 400° C. to room temperature at a rate of 100° C./h. All these heat-treatments are conducted in an oxygen atmosphere.

The following embodiment is included merely to aid in the understanding of the present invention, and variations may be made by one skilled in the art without departing from the spirit and scope of the invention.

The stoichiometric mixture of $Y_2O_3$, $BaCO_3$, and CuO for $YBa_2Cu_3O_y$ was calcined twice at 920° C. for 24 hours, and sintered as a pellet at 950° C. for 24 hours in an oxygen atmosphere. The mixture of $Y_2O_3$, $BaCO_3$, and CuO for $Y_2BaCuO_5$ stoichiometry was formed as a pellet and calcined in air at 950° C. for 24 hours.

Figure 2A:
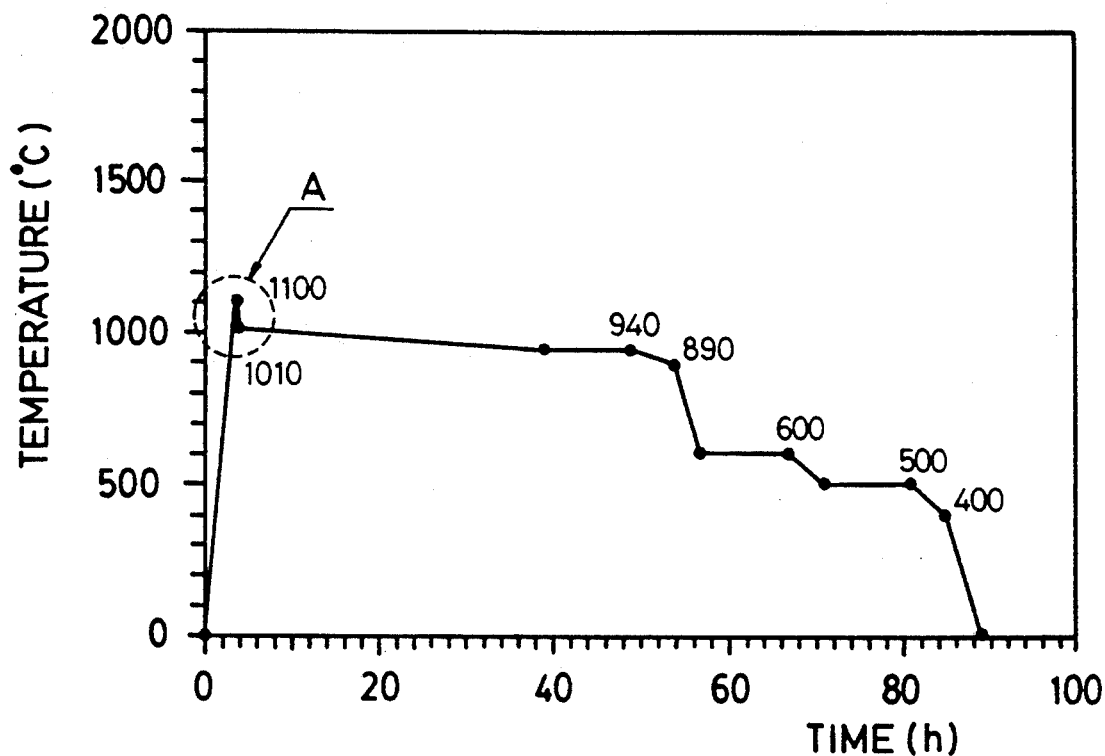
FIG. 2(a) illustrates a heat-treatment schedule used in practicing the present invention.
Figure 2B:
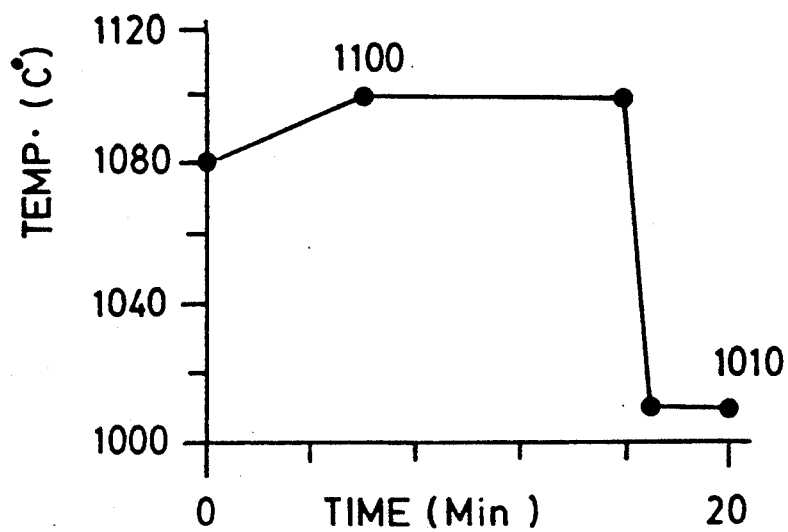
FIG. 2(b) illustrates an enlargement of part A in FIG. 2(a).

The $YBa_2Cu_3O_y$ and $Y_2BaCuO_5$ pellets which are respectively designated 123 and 211 in FIG. 1 were stacked on a $ZrO_2$ plates, as shown in FIG. 1. This system was heat-treated following the schedule shown in FIG. 2. It was heated to 1100° C. at a rate of about 300° C./h and held for 10 minutes to partially-melt the upper body of $YBa_2Cu_3O_y$ compound. During this period, the liquid phase of $BaCuO_2.CuO$ flowed down into the lower $Y_2BaCuO_5$ plate. After being quenched to 1010° C., the system was cooled to 940° C. slowly at a rate of 2° C./h and held at this temperature for about 10 hours to complete the peritectic reaction. After the system was cooled slowly (10° C./h) within the range of 940° C.-890° C., it was furnace-cooled to 600° C. (100° C./h). To avoid crack-formation during the tetragonal-to-orthorhombic phase transition, the system was cooled slowly (25° C./h) within the range of 600° C.-400° C.

Figure 3:
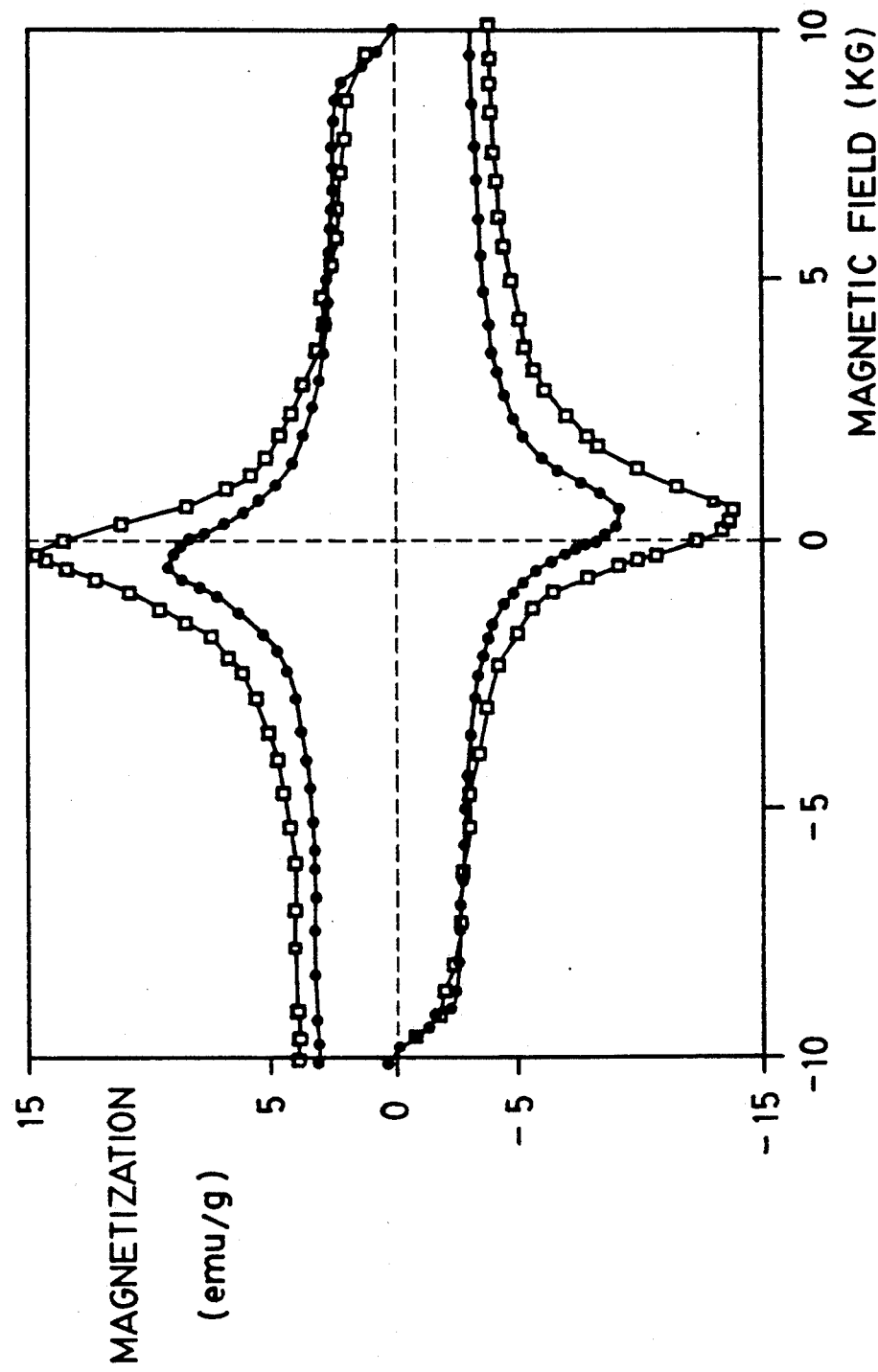
FIG. 3 is a graph of magnetic field vs. magnetization for the superconductors manufactured in practicing the process of the present invention and in practicing the convention QMG method.

Using a diamond saw, several pieces of 0.5 mm×3 mm×8 mm were cut from the lower part of the system, which was initially $Y_2BaCuO_5$ plate. The microstructure and electric properties were measured. The magnetization property (FIG. 3) was measured and compared with that of the superconductors manufactured by the prior QMG method. In FIG. 3, the magnetization curve of superconductors manufactured by the prior QMG method and by the present invention are represented by "●" and "□", respectively. The estimation from this figure shows that the critical current density of the superconductor manufactured in the present invention was 2 times greater than that of the superconductors made by the prior QMG method.

Figure 4A:
FIG. 4(a) is a SEM measurement of a superconductor prepared by the conventional QMG method.
Figure 4B:
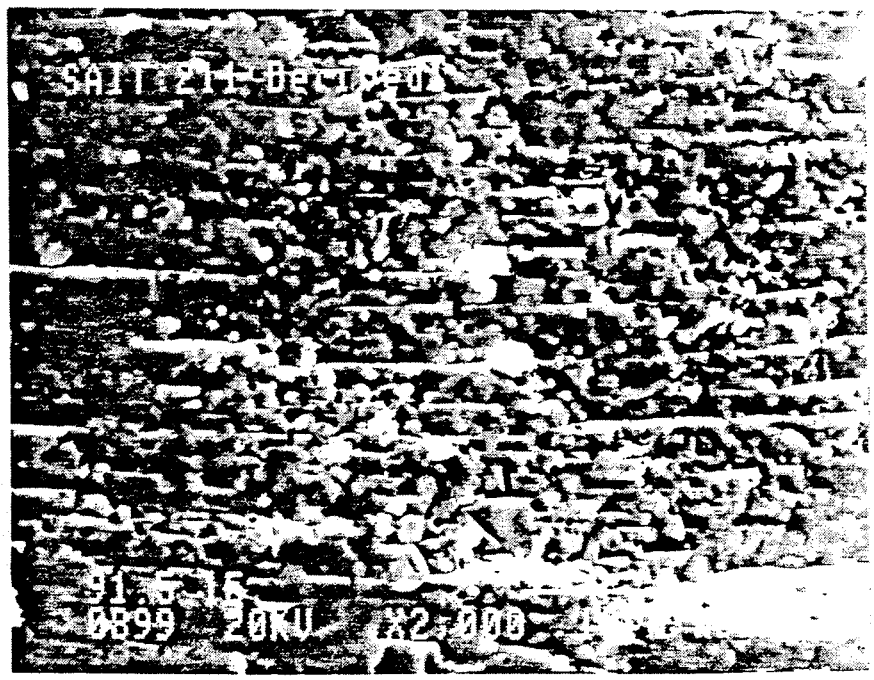
FIG. 4(b) is a SEM measurement of superconductors prepared using the process of the present invention.

The photos in FIG. 4 show the SEN measurements of the superconductors prepared by the conventional QMG method (a) and by this invention (b). Both superconductors have well-oriented grains with few voids. However, it is to be noted that the $Y_2BaCuO_5$ phases in the present method are uniformly dispersed with a diameter of less than 1 μm. These fine $Y_2BaCuO_5$ phases act as flux-pinning centers so that the critical current density is greatly enhanced.

What we claim is:
1. A process for preparing a yttrium-based superconductor, comprising:
 (a) partially melting a body of $YBa_2Cu_3O_y$ while stacked on a plate of $Y_2BaCuO_5$, by heating said body and said plate at a rate of about 300° C./hour from room temperature, to an elevated temperature of about 1100° C.; and maintaining said elevated temperature for ten minutes, to thereby produce a liquid phase, $BaCuO_2.CuO$, which flows down into the plate of $Y_2BaCuO_5$;
 (b) allowing the $BaCuO_2.CuO$ of the liquid phase to peritectically react with the $Y_2BaCuO_5$ in said plate by quenching said system from 1100° C. to 1010° C., cooling to 940° C. at a rate of 2° C./hour, and then maintaining said system at 940° C. for about ten hours, to form a $YBa_2Cu_3O_y$ phase of a $YBa_2Cu_3O_y$ and $Y_2Ba_2CuO_5$ system and
 (c) cooling and annealing said $YBa_2Cu_3O_y$ phase of said system by cooling said system from about 940° C. to 890° C. at a rate of 10°/hour, then further cooling said system from 890° C. to 600° C. at a rate of 100° C./hour, then further cooling said system from 600° C. to 400° C. at a rate of 25° C./hour. and finally cooling said system in an oxygen atmosphere from 400° C. to room temperature at a rate of 100° C./hours, to thereby provide said plate with superconducting properties.

2. The method of claim 1, further comprising:
sawing across the plate formed in step (c) to thereby sever therefrom a porous $Y_2BaCuO_5$ remainder body.

* * * * *